US 12,464,689 B2

(12) United States Patent
Vijayaraghavan et al.

(10) Patent No.: US 12,464,689 B2
(45) Date of Patent: Nov. 4, 2025

(54) THERMAL MANAGEMENT SYSTEM FOR A POWER CONVERTER

(71) Applicant: General Electric Company, Schenectady, NY (US)

(72) Inventors: Sanjay Vijayaraghavan, Bangalore (IN); Libing Wang, Niskayuna, NY (US); Han Xiong, Niskayuna, NY (US); Kum Kang Huh, Niskayuna, NY (US); Di Pan, Schenectady, NY (US); Mark Edward Dame, Niskayuna, NY (US); Rajib Datta, Niskayuna, NY (US); Alankrita Singh, Bhilai (IN)

(73) Assignee: General Electric Company, Schenectady, NY (US)

( * ) Notice: Subject to any disclaimer, the term of this patent is extended or adjusted under 35 U.S.C. 154(b) by 421 days.

(21) Appl. No.: 18/081,770

(22) Filed: Dec. 15, 2022

(65) Prior Publication Data

US 2023/0389241 A1    Nov. 30, 2023

(30) Foreign Application Priority Data

May 26, 2022    (IN) .............................. 202211030257

(51) Int. Cl.
*H05K 7/20* (2006.01)
*H05K 5/02* (2006.01)

(52) U.S. Cl.
CPC ....... *H05K 7/20927* (2013.01); *H05K 5/0217* (2013.01)

(58) Field of Classification Search
CPC .. H05K 7/14337; H05K 7/20; H05K 7/20218; H05K 7/20236; H05K 7/20254; H05K 7/20272; H05K 7/20282; H05K 7/203; H05K 7/20336; H05K 7/20627; H05K 7/2089; H05K 7/209; H05K 7/20927; H05K 7/20936; H05K 9/0015; H05K 5/0217; H01L 23/44; H01L 23/473
See application file for complete search history.

(56) References Cited

U.S. PATENT DOCUMENTS 7,385,821 B1 *  6/2008  Feierbach ........... H01L 23/4332
                                                                361/699
8,369,090 B2     2/2013  Chester et al.
(Continued)

FOREIGN PATENT DOCUMENTS

EP         2825008 A1      1/2015
WO    WO2018/025016 A1    2/2018

OTHER PUBLICATIONS

Ensinger Plastics, Thermally Conducting Compounds. More than Just One Option: Tecacomp TC, Compounds, 3 Pages. Retrieved Aug. 23, 2021 from Web Page: https://www.ensingerplastics.com/en-us/compounds/thermally-conductive.

(Continued)

*Primary Examiner* — Amir A Jalali
(74) *Attorney, Agent, or Firm* — Smith, Gambrell & Russell, LLP

(57) ABSTRACT

A power converter assembly includes a housing, a cold plate in the housing, and a set of power converter components on the cold plate. The cold plate is configured to receive a coolant. A first medium in the housing surrounds the cold plate and components. An expandable heat transfer structure is attached to one of the cold plate and the housing.

20 Claims, 6 Drawing Sheets

(56) References Cited

U.S. PATENT DOCUMENTS

| | | | | |
|---|---|---|---|---|
| 8,929,080 B2 * | 1/2015 | Campbell | ................ | H05K 7/20 |
| | | | | 257/714 |
| 9,414,520 B2 * | 8/2016 | Campbell | .......... | H05K 7/20936 |
| 9,686,889 B2 | 6/2017 | Campbell et al. | | |
| 10,070,558 B2 | 9/2018 | Campbell et al. | | |
| 10,193,340 B2 | 1/2019 | Specht et al. | | |
| 10,542,640 B1 | 1/2020 | Leigh et al. | | |
| 11,659,683 B1 * | 5/2023 | Gao | ................... | H05K 7/20236 |
| | | | | 361/699 |
| 11,800,683 B2 * | 10/2023 | Horng | .................... | H05K 7/203 |
| 12,336,152 B2 * | 6/2025 | Gao | ................... | H05K 7/20318 |
| 2019/0383559 A1 * | 12/2019 | Aoki | ................... | F28D 1/05316 |
| 2022/0264768 A1 * | 8/2022 | Horng | ............... | H05K 7/20327 |
| 2022/0322570 A1 * | 10/2022 | Meneboo | ........... | H05K 7/20272 |
| 2023/0156959 A1 * | 5/2023 | Malouin | ............ | H05K 7/20263 |
| | | | | 361/699 |
| 2023/0217630 A1 * | 7/2023 | Gao | ................... | H05K 7/20818 |
| | | | | 361/699 |
| 2024/0260228 A1 * | 8/2024 | Chuang | .............. | H05K 7/20236 |

OTHER PUBLICATIONS

TCPoly, Thermally Conductive Plastics for 3D Printing, 4 Pages. Retrieved Aug. 23, 2021 from Web Page: https://tcpoly.com/.

* cited by examiner

THERMAL MANAGEMENT SYSTEM FOR A POWER CONVERTER

PRIORITY INFORMATION

The present application claims priority to Indian Patent Application Number 202211030257 filed on May 26, 2022.

FIELD

The present disclosure relates to a thermal management system for a power converter.

BACKGROUND

A gas turbine engine generally includes a turbomachine and a rotor assembly. Gas turbine engines, such as turbofan engines, may be used for aircraft propulsion. In the case of a turbofan engine, the rotor assembly may be configured as a fan assembly.

A gas turbine engine may have a power converter, for example, that is coupled to a generator. Power converters are used to convert electrical energy from one form to another. For example, a power converter may convert current between alternating current (AC) and direct current (DC). A power converter may also modify a combination of voltage, current, and/or frequency from an input power to a resulting output power.

In aircraft engines, power converters are desired to be lightweight, compact, integrate with a thermal management system (TMS), and operate at high altitude where low ambient pressure introduces increased risk of dielectric breakdown. As high-power converters are desired to be capable of dealing with higher temperature operation (e.g., due to high voltage, high current thermal losses, and/or engine thermal environment), improvements to power converters would be welcomed.

BRIEF DESCRIPTION OF THE DRAWINGS

A full and enabling disclosure of the present disclosure, including the best mode thereof, directed to one of ordinary skill in the art, is set forth in the specification, which makes reference to the appended figures, in which.

DETAILED DESCRIPTION

Figure 1:
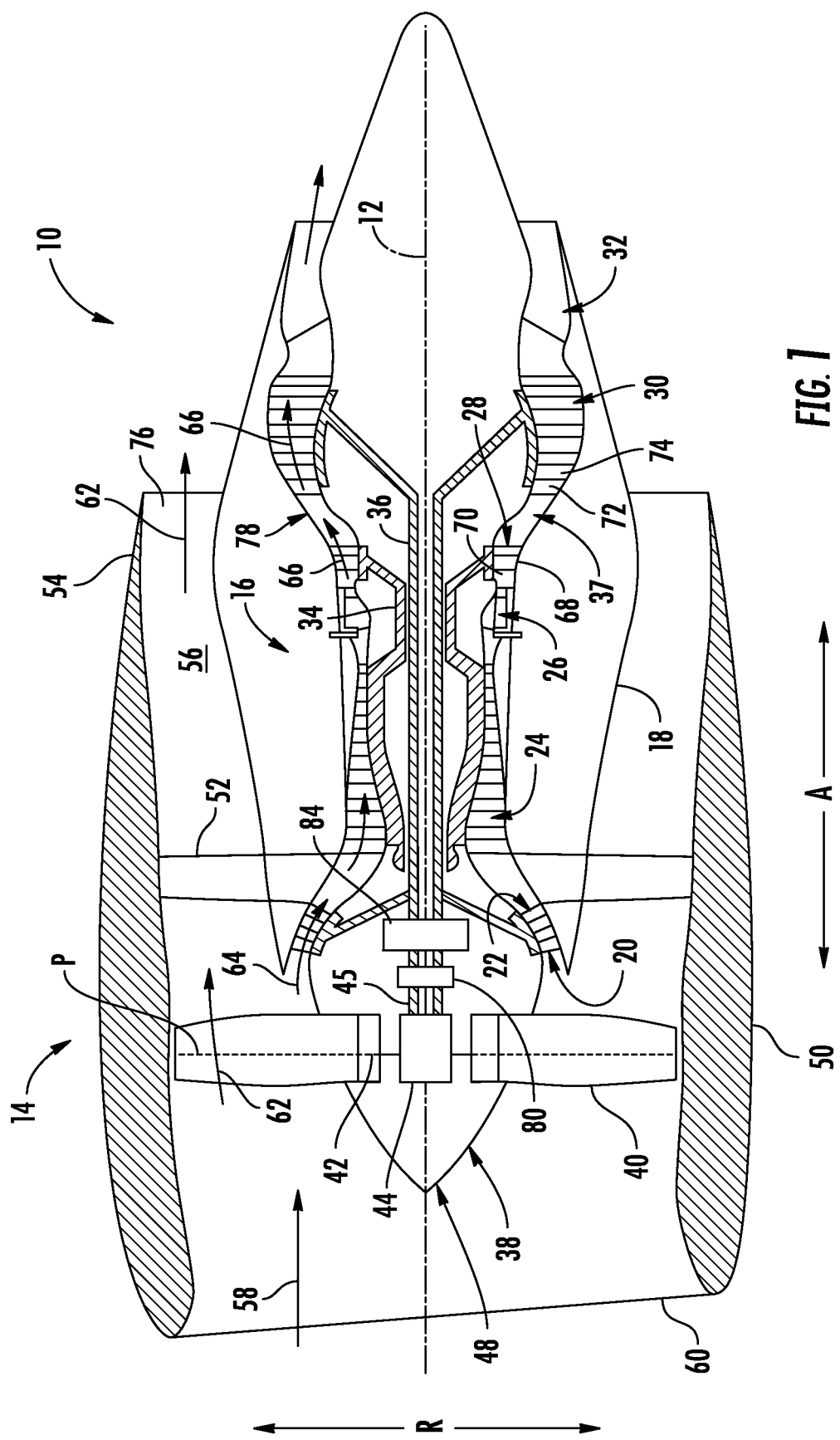
FIG. 1 is a cross-sectional view of a gas turbine engine in accordance with an exemplary aspect of the present disclosure.

Reference will now be made in detail to present embodiments of the disclosure, one or more examples of which are illustrated in the accompanying drawings. The detailed description uses numerical and letter designations to refer to features in the drawings. Like or similar designations in the drawings and description have been used to refer to like or similar parts of the disclosure.

The word "exemplary" is used herein to mean "serving as an example, instance, or illustration." Any implementation described herein as "exemplary" is not necessarily to be construed as preferred or advantageous over other implementations. Additionally, unless specifically identified otherwise, all embodiments described herein should be considered exemplary.

For purposes of the description hereinafter, the terms "upper", "lower", "right", "left", "vertical", "horizontal", "top", "bottom", "lateral", "longitudinal", and derivatives thereof shall relate to the invention as it is oriented in the drawing figures. However, it is to be understood that the invention may assume various alternative variations, except where expressly specified to the contrary. It is also to be understood that the specific devices illustrated in the attached drawings, and described in the following specification, are simply exemplary embodiments of the invention. Hence, specific dimensions and other physical characteristics related to the embodiments disclosed herein are not to be considered as limiting.

As used herein, the terms "first," "second," and "third" may be used interchangeably to distinguish one component from another and are not intended to signify location or importance of the individual components.

The terms "forward" and "aft" refer to relative positions within a gas turbine engine or vehicle, and refer to the normal operational attitude of the gas turbine engine or vehicle. For example, with regard to a gas turbine engine, forward refers to a position closer to an engine inlet and aft refers to a position closer to an engine nozzle or exhaust.

The terms "upstream" and "downstream" refer to the relative direction with respect to fluid flow in a fluid pathway. For example, "upstream" refers to the direction from which the fluid flows, and "downstream" refers to the direction to which the fluid flows.

The terms "coupled," "fixed," "attached to," and the like refer to both direct coupling, fixing, or attaching, as well as indirect coupling, fixing, or attaching through one or more intermediate components or features, unless otherwise specified herein.

The singular forms "a," "an," and "the" include plural references unless the context clearly dictates otherwise.

Approximating language, as used herein throughout the specification and claims, is applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value, or the precision of the methods or machines for constructing or manufacturing the components and/or systems. For example, the approximating language may refer to being within a 1, 2, 4, 10, 15, or 20 percent margin. These approximating margins may apply to a single value, either or both endpoints defining numerical ranges, and/or the margin for ranges between endpoints.

Here and throughout the specification and claims, range limitations are combined and interchanged, such ranges are identified and include all the sub-ranges contained therein unless context or language indicates otherwise. For example, all ranges disclosed herein are inclusive of the endpoints, and the endpoints are independently combinable with each other.

The term "turbomachine" or "turbomachinery" refers to a machine including one or more compressors, a heat generating section (e.g., a combustion section), and one or more turbines that together generate a torque output.

The term "gas turbine engine" refers to an engine having a turbomachine as all or a portion of its power source. Example gas turbine engines include turbofan engines, turboprop engines, turbojet engines, turboshaft engines, etc.

The term "combustion section" refers to any heat addition system for a turbomachine. For example, the term combustion section may refer to a section including one or more of a deflagrative combustion assembly, a rotating detonation combustion assembly, a pulse detonation combustion assembly, or other appropriate heat addition assembly. In certain example embodiments, the combustion section may include an annular combustor, a can combustor, a cannular combustor, a trapped vortex combustor (TVC), or other appropriate combustion system, or combinations thereof.

The terms "low" and "high," or their respective comparative degrees (e.g., -er, where applicable), when used with a compressor, a turbine, a shaft, or spool components, etc. each refer to relative speeds within an engine unless otherwise specified. For example, a "low turbine" or "low speed turbine" defines a component configured to operate at a rotational speed, such as a maximum allowable rotational speed, lower than a "high turbine" or "high speed turbine" in the engine.

The present disclosure is generally related to a power converter assembly including an expandable heat transfer structure.

A power converter may interface with a generator. The generator may be coupled to the aircraft engine main shaft that drives the generator to generate electrical power. The electrical power is provided from the generator to the power converter.

The components of the power converter may be potted (e.g., covered with an epoxy that is electrically insulating with good thermal conductivity (e.g., a dielectric epoxy) or other solid insulation material) and/or surrounded by a dielectric medium to protect against high voltage arc and discharge, sparking, and other damaging events.

The power converter may be located in a high-temperature environment (e.g., high thermal ambient temperature). In general, the components of the power converter may reject heat directly to a coolant in a cold plate or to the dielectric medium surrounding the power converter. The power converter may also be isolated from the ambient temperature by a housing.

The power converter assembly includes an expandable heat transfer structure that is disposed in the housing of the power converter and, particularly, in the dielectric medium (e.g., a dielectric fluid) surrounding the components of the power converter. The expandable heat transfer structure includes a conductive material such that heat is transferred from the dielectric medium to the expandable heat transfer structure and then from the expandable heat transfer structure to one of the housing or a cold plate to which the expandable heat transfer structure is attached.

The dielectric fluid (e.g., either liquid or pressurized gas) is charged into the converter box and is isolated from the ambient to avoid loss of dielectric fluid (gas or liquid). In a sealed container, as temperatures change, the pressure of the dielectric fluid will fluctuate. Pressure change may be severe for liquids due to incompressible nature of the substance. Bellows compensate for expansion of the dielectric fluid to avoid excessive pressure buildup in the converter box. High pressures can increase risk of mechanical damage of the converter or an increased risk of leakage.

The density of the dielectric fluid or other dielectric medium in the expandable heat transfer structures may be less than the density of the dielectric medium to reduce the overall weight of the power converter assembly.

Referring now to the drawings, wherein identical numerals indicate the same elements throughout the figures, FIG. 1 is a schematic cross-sectional view of a gas turbine engine in accordance with an exemplary embodiment of the present disclosure. More particularly, for the embodiment of FIG. 1, the gas turbine jet engine is an aeronautical, turbofan engine 10, configured to be mounted to an aircraft, such as in an under-wing configuration or tail-mounted configuration.

As shown in FIG. 1, the turbofan engine 10 defines an axial direction A (extending parallel to a centerline axis 12 provided for reference), a radial direction R, and a circumferential direction (i.e., a direction extending about the axial direction A; not depicted).

In general, the turbofan engine 10 includes a fan section 14 and a turbomachine 16 disposed downstream from the fan section 14. The turbomachine 16 is sometimes also, or alternatively, referred to as a "core turbine engine".

The turbomachine 16 includes an outer casing 18 that is tubular and defines an inlet 20. The outer casing 18 encases, in serial flow relationship: a compressor section including a first, booster or low pressure (LP) compressor 22 and a second, high pressure (HP) compressor 24; a combustion section including a combustor 26; a turbine section including a first, high pressure (HP) turbine 28 and a second, low pressure (LP) turbine 30; and a jet exhaust nozzle section 32.

A high pressure (HP) shaft 34 or spool drivingly connects the HP turbine 28 to the HP compressor 24. A low pressure (LP) shaft 36 or spool drivingly connects the LP turbine 30 to the LP compressor 22. The compressor section, combustion section, turbine section, and jet exhaust nozzle section 32 are arranged in serial flow order and together define a core air flowpath 37 through the turbomachine 16.

The fan section 14 includes a fan 38 (e.g., variable pitch, single stage). The fan 38 includes a plurality of fan blades 40 coupled to a disk 42 in a spaced apart manner. As depicted, the fan blades 40 extend outwardly from disk 42 generally along the radial direction R.

The fan blades 40 are operatively coupled to one or more actuation members 44. For example, the actuation members 44 may be configured to collectively or independently vary the pitch of the fan blades 40 with respect to pitch axis P. As described in further detail below, the fan blades 40 may have a forward pitch to produce a forward thrust or may have a reverse pitch to produce a reverse thrust.

A fan drive shaft 45 is operatively connected to and drives the fan 38. The fan blades 40, disk 42, and actuation member 44 are together rotatable about the centerline axis 12 by the fan drive shaft 45. The fan section 14 is connected to the turbomachine 16 during a forward thrust operation. In particular, the fan drive shaft is connected to the LP shaft 36.

The disk 42 is covered by a rotatable front nacelle 48 aerodynamically contoured to promote an airflow through the plurality of fan blades 40. Additionally, the fan section 14 includes an annular fan casing or outer nacelle 50 that at least partially, and for the embodiment depicted, circumferentially, surrounds the fan 38 and at least a portion of the turbomachine 16.

Moreover, for the embodiment depicted, the nacelle 50 is supported relative to the turbomachine 16 by a plurality of outlet guide vanes 52. A downstream section 54 of the nacelle 50 extends over an outer portion of the turbomachine 16 to define a bypass airflow passage 56 therebetween.

During a forward thrust operation of the turbofan engine 10, a volume of air 58 enters the turbofan engine 10 through an associated inlet 60 of the nacelle 50 and/or fan section 14. As the volume of air 58 passes across fan blades 40, a first portion of the air 58 as indicated by arrows 62 is directed or routed into the bypass airflow passage 56 and a second portion of the air 58 as indicated by arrow 64 is directed or routed into the core air flowpath 37.

The pressure of the second portion of air 64 is increased as it is routed through the LP compressor 22 and the HP compressor 24 and into the combustor 26. More specifically, the compressor section, including the LP compressor 22 and HP compressor 24, defines an overall pressure ratio during operation of the turbofan engine 10 at a rated speed. The overall pressure ratio refers to a ratio of an exit pressure of the compressor section (i.e., a pressure of the second portion of air 64 at an aft end of the compressor section) to an inlet pressure of the compressor section (i.e., a pressure of the second portion of air 64 at the inlet 20 to the compressor section).

The compressed second portion of air 64 from the compressor section mixes with fuel and is burned within the combustion section to provide combustion gases 66. The combustion gases 66 are routed from the combustor 26, through the HP turbine 28 where a portion of thermal and/or kinetic energy from the combustion gases 66 is extracted via sequential stages of HP turbine stator vanes 68 that are coupled to the outer casing 18 and a plurality of HP turbine rotor blades 70 that are coupled to the HP shaft 34 or spool, thus causing the HP shaft 34 or spool to rotate, thereby supporting operation of the HP compressor 24.

The combustion gases 66 are then routed through the LP turbine 30 where a second portion of thermal and kinetic energy is extracted from the combustion gases 66 via sequential stages of LP turbine stator vanes 72 that are coupled to the outer casing 18 and a plurality of LP turbine rotor blades 74 that are coupled to the LP shaft 36 or spool, thus causing the LP shaft 36 or spool to rotate, thereby supporting operation of the LP compressor 22 and/or rotation of the fan 38.

The combustion gases 66 are subsequently routed through the jet exhaust nozzle section 32 of the turbomachine 16 to provide propulsive thrust. Simultaneously, the pressure of the first portion of air 62 is substantially increased as the first portion of air 62 is routed through the bypass airflow passage 56 before it is exhausted from a fan nozzle exhaust section 76 of the turbofan engine 10, also providing propulsive thrust. The HP turbine 28, the LP turbine 30, and the jet exhaust nozzle section 32 at least partially define a hot gas path 78 for routing the combustion gases 66 through the turbomachine 16.

During operation of the turbofan engine 10, the fan 38 defines a fan pressure ratio. As used herein, the term "fan pressure ratio" refers to a ratio of an air pressure immediately downstream of the fan to an air pressure immediately upstream of the fan.

It should be appreciated that the exemplary engine 10 depicted in FIG. 1 is by way of example only, and that in other exemplary embodiments, the engine 10 may have any other suitable configuration. For example, aspects of the present disclosure may be utilized with any other suitable aeronautical gas turbine engine, such as a turboshaft engine, turboprop engine, turbojet engine, etc. Further, aspects of the present disclosure may further be utilized with any aeroderivative gas turbine engine, such as a nautical gas turbine engine.

Figure 2:
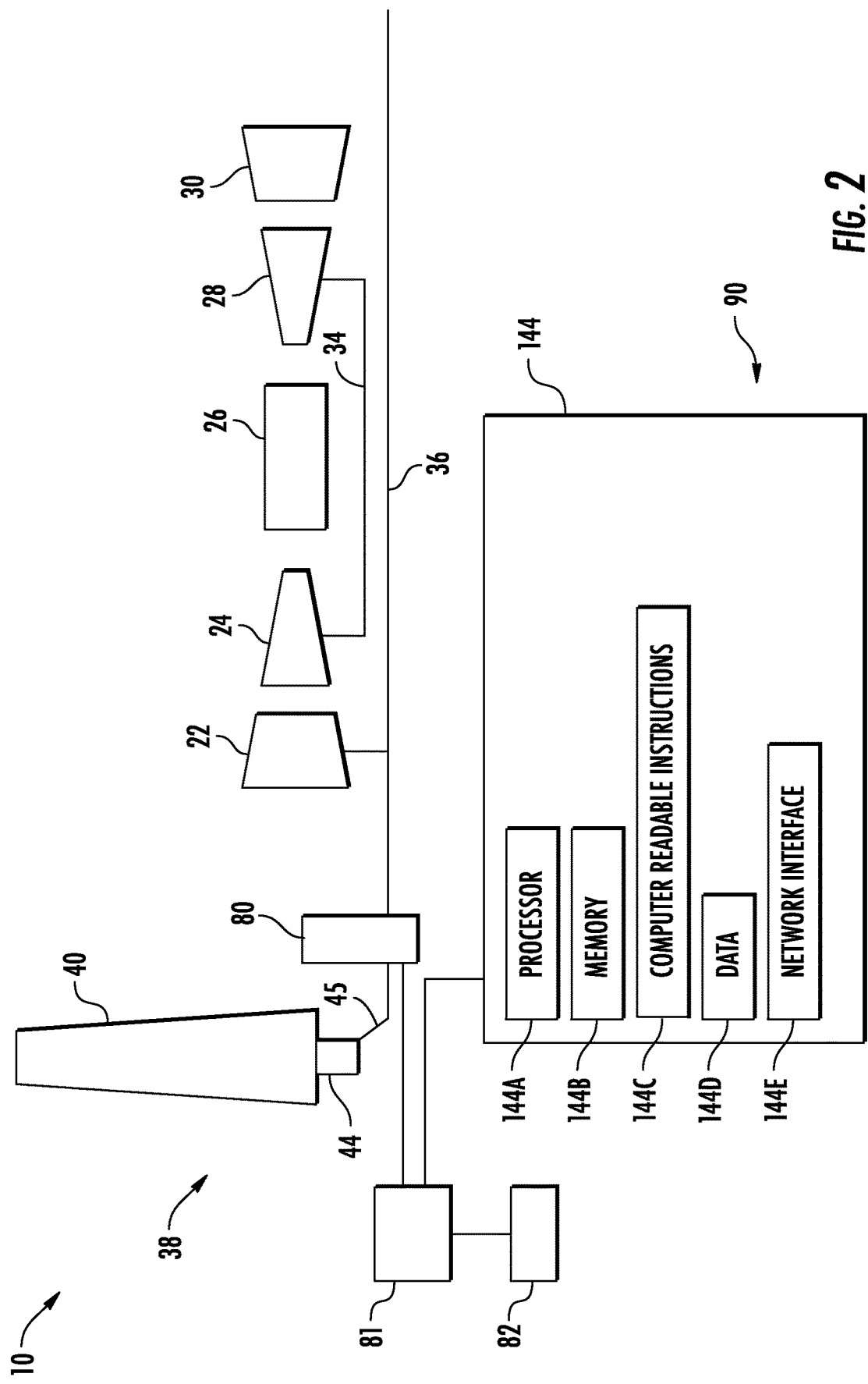
FIG. 2 is a schematic illustration of the gas turbine engine of FIG. 1 in accordance with an exemplary aspect of the present disclosure.

Referring now also to FIG. 2, providing a schematic illustration of the turbofan engine 10, the turbofan engine 10 further includes an electric machine 80 coupled to the fan drive shaft 45. The electric machine 80 is configured to operate as a generator to convert rotation of the fan drive shaft 45 to electric energy. The electric machine 80 is also configured to operate as a motor to convert electric energy into rotation of the fan drive shaft 45.

The electric machine may be alternatively positioned and multiple electric machines are envisaged. For example, an electric machine may be on the LP shaft and/or the HP shaft.

The electric machine 80 may generally include a stator and a rotor, the rotor rotatable relative to the stator. Additionally, the electric machine 80 may be configured in any suitable manner for converting mechanical power to electrical power and electrical power to mechanical power. For example, the electric machine may be configured as an asynchronous or induction electric machine operable to generate or utilize alternating current (AC) electric power. Alternatively, the electric machine may be configured as a synchronous electric machine operable to generate or utilize AC electric power or direct current (DC) electric power. In such a manner it will be appreciated that the stator, the rotor, or both may generally include one or more of a plurality of coils or winding arranged in any suitable number of phases, one or more permanent magnets, one or more electromagnets, etc. Other exemplary electric machines may be used as well.

Moreover, it will be appreciated that for the exemplary embodiment depicted, the electric machine 80 is generally configured coaxially with the centerline axis 12 of the turbofan engine 10, which for the embodiment depicted means the electric machine 80 is also configured coaxially with the fan drive shaft 45 and the LP shaft 36. With such a configuration, the electric machine 80 may be referred to as an "embedded" electric machine. In other embodiments, however, the electric machine may not be coaxial with the centerline axis 12 of the turbofan engine 10, and instead may be offset and connected through, e.g., a suitable geartrain.

An energy storage device 82 is configured to store electric energy generated by the electric machine 80. The energy storage device 82 provides stored electric energy to the electric machine 80 when it operates as a motor.

A power converter assembly 81 (e.g., a power conditioning and distribution device) may connect the electric machine 80 to the energy storage device 82. In general, the power converter assembly 81 may include power electronics or similar structure for, e.g., converting electric power between AC and DC electric power. The power converter assembly 81 is described in further detail below with respect to FIG. 3.

It will be appreciated, however, that in other exemplary embodiments, the electric machine 80 may additionally or alternatively be in electrical communication with any other suitable power source and/or power storage assembly, and to electric loads.

Referring to FIG. 2, a controller 90 may control the power converter assembly 81. In general, the controller 90 depicted in FIG. 2 is configured to receive the data sensed from the one or more sensors, or commands received from one or more systems and, e.g., make control decisions based on the received data or commands.

In one or more exemplary embodiments, the controller 90 depicted in FIG. 2 may be a stand-alone controller, or alternatively, may be integrated into one or more of a controller for the turbofan engine 10, a controller for an aircraft including the turbofan engine 10, etc.

Referring particularly to the operation of the controller 90, in at least certain embodiments, the controller 90 can include one or more computing device(s) 144. The computing device(s) 144 can include one or more processor(s) 144A and one or more memory device(s) 144B. The one or more processor(s) 144A can include any suitable processing device, such as a microprocessor, microcontroller, integrated circuit, logic device, and/or other suitable processing device. The one or more memory device(s) 144B can include one or more computer-readable media, including, but not limited to, non-transitory computer-readable media, RAM, ROM, hard drives, flash drives, and/or other memory devices.

The one or more memory device(s) 144B can store information accessible by the one or more processor(s) 144A, including computer-readable instructions 144C that can be executed by the one or more processor(s) 144A. The instructions 144C can be any set of instructions that when executed by the one or more processor(s) 144A, cause the one or more processor(s) 144A to perform operations. In some embodiments, the instructions 144C can be executed by the one or more processor(s) 144A to cause the one or more processor(s) 144A to perform operations, such as any of the operations and functions for which the controller 90 and/or the computing device(s) 144 are configured, the operations for operating the turbofan engine 10, as described herein, and/or any other operations or functions of the one or more computing device(s) 144.

The instructions 144C can be software written in any suitable programming language or can be implemented in hardware. Additionally, and/or alternatively, the instructions 144C can be executed in logically and/or virtually separate threads on processor(s) 144A.

The one or more memory device(s) 144B can further store data 144D that can be accessed by the processor(s) 144A. For example, the data 144D can include data indicative of temperature or pressure of the power converter assembly any other data and/or information described herein.

The computing device(s) 144 can also include a network interface 144E used to communicate, for example, with the other components of the turbofan engine the aircraft incorporating the gas turbine engine, etc. The controller 90 is operably coupled to the one or more aircraft systems (e.g., a flight management system or other aircraft control system) through, e.g., the network interface, such that the controller 90 may receive data or commands.

The network interface 144E can include any suitable components for interfacing with one or more network(s), including for example, transmitters, receivers, ports, controllers, antennas, and/or other suitable components.

The technology discussed herein makes reference to computer-based systems and actions taken by and information sent to and from computer-based systems. One of ordinary skill in the art will recognize that the inherent flexibility of computer-based systems allows for a great variety of possible configurations, combinations, and divisions of tasks and functionality between and among components. For instance, processes discussed herein can be implemented using a single computing device or multiple computing devices working in combination. Databases, memory, instructions, and applications can be implemented on a single system or distributed across multiple systems. Distributed components can operate sequentially or in parallel.

Although embodiments described herein are described with respect to a turbofan engine 10, the systems described herein may be implemented in any environment utilizing a power converter assembly 81 to convert power from one form to another.

Non-limiting examples of power converter utilization may include stepping up or stepping down voltage signals, increasing or decreasing current, converting AC power to DC power, converting DC power to AC power, combinations thereof, and the like. Non-limiting examples of environments utilizing the power converter assembly may include mobile or fixed structures, and mobile vehicles including land, sea, and air-based vehicles.

Figure 3:
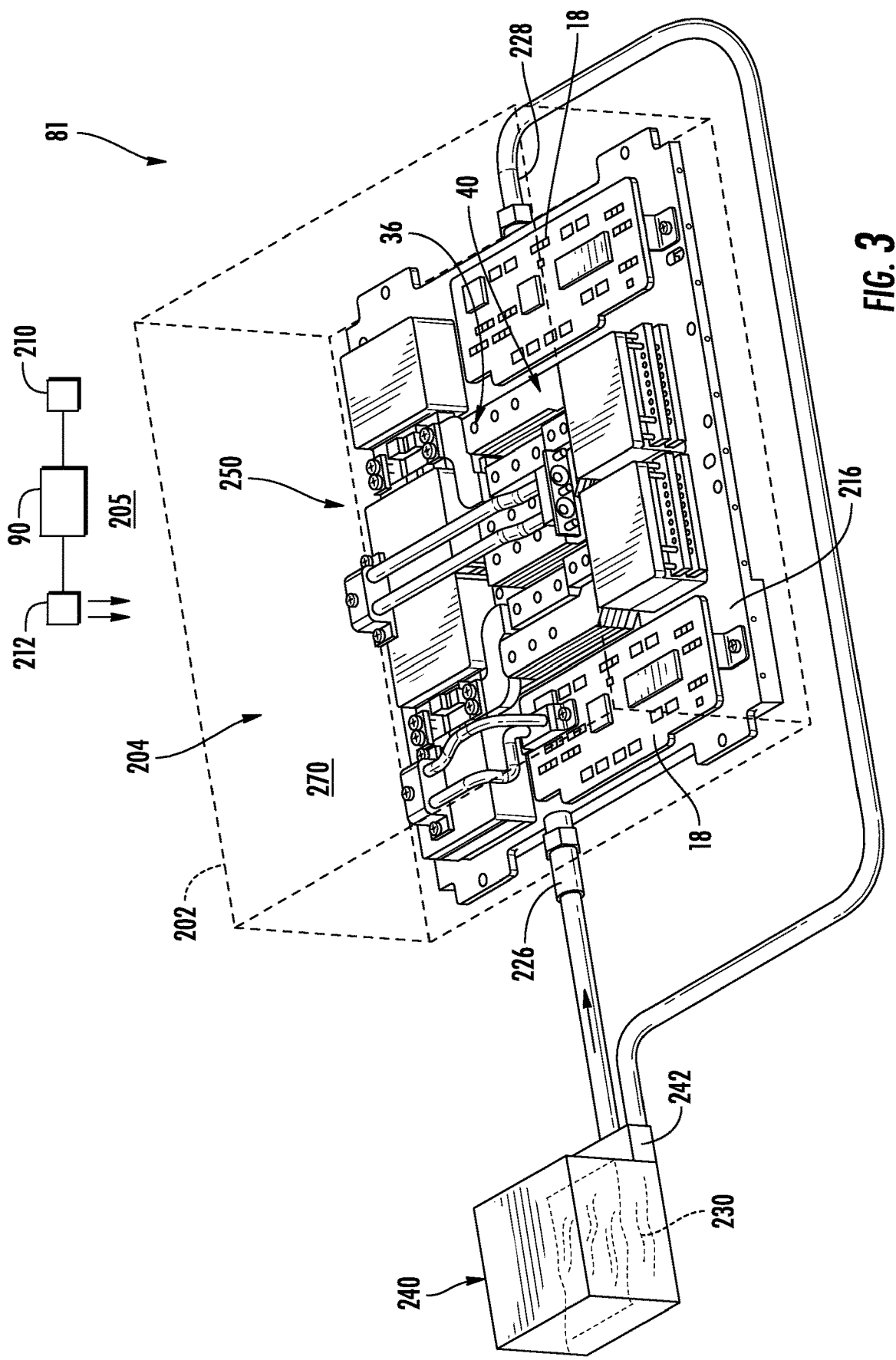
FIG. 3 is a perspective view of a power converter assembly in accordance with an exemplary aspect of the present disclosure.

Referring to FIG. 3, the power converter assembly 81 is described in further detail. The power converter assembly 81 includes a housing 202 (e.g., shown as a dotted box). Heat generating components of the power converter assembly 81 are included within a cavity 204 defined by the housing 202.

The housing 202 may be constructed from a thermally conductive material, such as aluminum. The housing 202 may include additional housing elements configured for heat management considerations such as pin fins, parallel fins, etc.

The outer surface of the housing 202 may be exposed to one or more external cooling mediums (e.g., an external cooling medium 205) for heat management. The external cooling medium 205 provides heat transfer away from the power converter assembly 81. The external cooling medium 205 may include ambient air or forced convection air delivered to the outer surface of the housing 202.

For example, the power converter assembly 81 includes a temperature sensor 210 to measure the ambient temperature and a control valve 212 to circulate the external cooling medium 205. The controller 90 may receive a measurement from the temperature sensor 210 and control the control valve 212 to circulate the external cooling medium 205 around the housing 202 based on the measurement from the temperature sensor 210.

Additionally or alternatively, the power converter assembly 81 may include an actuator using a temperature sensing element (e.g., a shape memory alloy) to thermally connect or isolate the enclosure. At low ambient temperatures, the shape memory alloy may be in contact with ambient temperature of the external cooling medium 205. At higher ambient temperatures, the shape memory allow may deform and break a bond or otherwise cut off contact with the ambient temperature of the external cooling medium 205. Accordingly, the shape memory alloy prevents thermal conduction from the ambient temperature of the external cooling medium 205 to the converter box enclosure or housing 202. In certain examples, the housing 202 may be covered by thermal shielding or radiation shielding metal.

The power converter assembly 81 may also include coolant channels (e.g., a cooling system as discussed below with respect to a cold plate is applied to the housing 202) that are in thermal contact with (e.g., integral to or attached to) the housing 202. The coolant channels are configured to remove heat from the housing if the outside thermal environment is hotter than inside the power converter assembly 81. Expandable heat transfer structures 280 that are connected to the housing 202 as described in further detail below may reject heat to the housing 202 which then rejects heat to the coolant channels in thermal contact with the housing 202.

The power converter assembly 81 may include several thermal regulating devices including a cold plate 216. The cold plate 216 may define a portion of the housing 202, such as a bottom wall. Alternatively, the cold plate 216 may be separate from the housing 202. The cold plate 216 may be formed from a metal or another conductive material.

The housing 202 may have an inlet port 226 and an outlet port 228 extending through the housing 202, external to the cavity 204, to provide an external coupling for, respectively, receiving and returning a coolant 230 for the cold plate 216.

The power converter assembly 81 may additionally include a coolant reservoir 240, illustrated as a schematic box including the coolant 230. The coolant reservoir 240 is coupled with the inlet port 226 and configured to deliver coolant 230 to the inlet port 226 to the cold plate 216. The coolant reservoir 240 is configured to receive coolant 230 from the cold plate 216 through the outlet port 228.

The coolant reservoir 240 may include a coolant pump 242 integrated with the coolant reservoir 240 that may be capable of delivering two to four gallons per minute (GPM) of coolant 230 (depending on the coolant) to the power converter assembly 81.

The coolant reservoir 240 may be configured with integrated or external mechanisms to cool and/or maintain the temperature of the coolant 230 below a threshold value. The threshold value may be a function of the specific environment for the power converter assembly 81 and/or specific characteristics of the power converter assembly 81.

For example, a threshold value for a gas turbine engine environment is ninety degrees Celsius for the coolant 230. However, alternative environmental temperatures, or temperature range for designated operations, may be included.

The coolant 230 may include fluids or gases. For example, the coolant 230 may include various liquids found in an aircraft engine including lube oil, fuel, supercritical $CO_2$ etc. or other dedicated heat transfer fluids.

FIG. 3 illustrates a perspective view of the cold plate 216 of the power converter assembly 81 showing components 250 of the power converter assembly 81 on the cold plate 216. The components 250 generate heat, for example, when performing power conversion functions.

Figure 4:
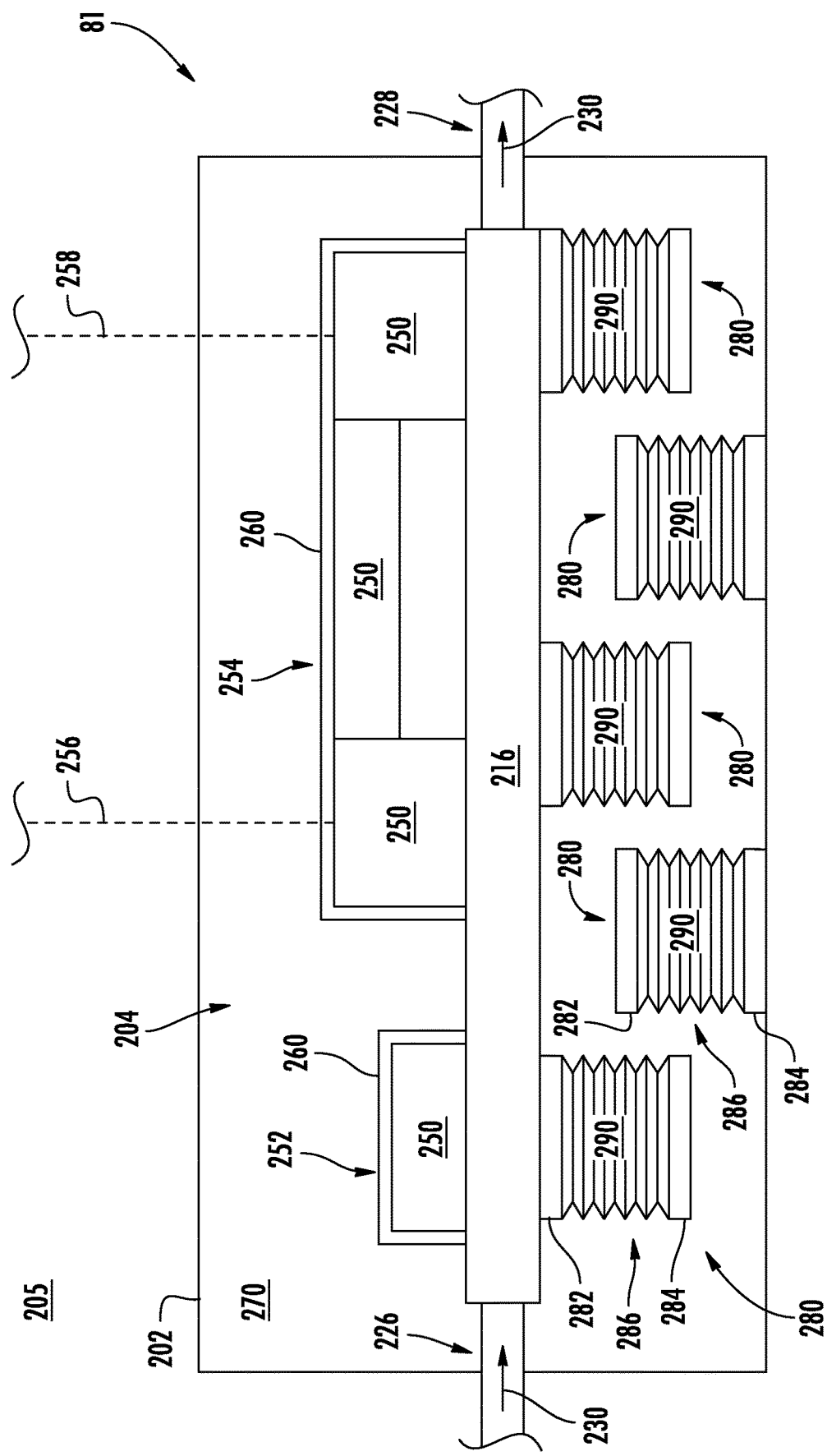
FIG. 4 is a schematic illustration of the power converter assembly of FIG. 3 in accordance with an exemplary aspect of the present disclosure.

Referring additionally to FIG. 4, schematically illustrating the power converter assembly 81, the components 250 may include a first set of components 252 and a second set of components 254. The first set of components 252 may be high power devices such as high-power switching modules (e.g., silicon carbide power metal-oxide-semiconductor field-effect transistors (MOSFETs), silicon carbon insulated-gate bipolar transistor (IGBT), silicon MOSFETs, silicon IGBTs, gate drivers, controls) that do a majority of the work and generate a majority of the heat. The second set of components 254 may be auxiliary devices or "balance of plant" devices (e.g., capacitors, inductors, resistors, bus bars, control boards, gate driver boards, interface boards, etc.).

Electrical connections 256, 258 (e.g., for control signals, see FIG. 4) between the components 250 in the housing 202 and devices or components outside the enclosure may extend through the housing 202 at sealed openings (not shown).

The components 250 may be covered with an epoxy 260 (i.e., potted, see FIG. 4) potting material that is electrically insulating with good thermal conductivity (e.g., a dielectric epoxy or other conductive epoxy), thermally conductive plastics, or other solid insulating material to provide insulation and reduce creep.

Creepage or creep distance (or leakage distance) relates to the surface shape of an insulator (e.g., the conductive epoxy 260). Creep distance represents the shortest distance along the surface of the insulator between conductive ends of an insulator. For example, one end may be at an elevated voltage level and the other end may be at a lower voltage or grounded. IEEE defines leakage distance as the sum of the shortest distances measured along the insulating surfaces between the conductive parts. Current leakage may cause damage and eventually failure of the insulator.

The conductive epoxy 260 may directly connect at least some components 250 to the cold plate 216. The conductive epoxy 260 improves coupling between the components 250 (i.e., heat sources) and the cold plate 216 to improve heat transfer from the components 250.

In certain embodiments, the potting around components 250 may include fluid transfer pathways for cooling.

Inside the housing 202, the cold plate 216 and the components 250 are surrounded by a first medium 270. Heat may be transferred from the components 250 to the first medium 270. For example, the first medium 270 may provide heat transfer for components 250 such as caps, inductors, resistors, contactors, bus bars, etc.

Heat may be transferred from the first medium 270 to the cold plate 216 and/or to the housing 202. As described in further detail below, heat may be transferred from the first medium 270 to the cold plate 216 and/or to the housing 202 via an expandable heat transfer structure 280 (see FIG. 4).

The first medium 270 provides dielectric resistance and electrical insulation for the components 250 to help prevent strike between components 250. The first medium 270 may be a liquid or pressurized gas that provides a desired dielectric resistance within the housing 202. For example, the first medium 270 may include dielectric liquids such as Fluorinert family of liquids from 3M™, Transformer Mineral Oil, Synthetic Ester based oils, synthetic hydrocarbons such as Alpha 6 Fluid™ (DSI Ventures™) or Ampcool-100™ (Engineered Fluids™). The medium could also be a pressurized gas using dry air, Nitrogen, $SF_6$ or its environmentally friendly alternatives such as g3 gas mixture.

Strike distance (sometimes referred to as dry arc distance, flashover distance, or tight string distance) depends on the medium surrounding the insulator. Strike distance is the shortest route in which voltage can "flash-over" or arc from the higher voltage to the lower voltage (or ground). IEEE defines the dry arc distance as the shortest distance through the surrounding medium between terminal electrodes.

The power converter assembly 81 includes expandable heat transfer structures 280 in the housing 202 (e.g., in the cavity 204). The expandable heat transfer structures 280 may be connected to the housing 202 or the cold plate 216 and disposed in the first medium 270. The expandable heat transfer structures 280 provide additional surface area in contact with the first medium 270 to improve heat transfer from the first medium 270 to the housing 202 or cold plate 216. For example, the expandable heat transfer structures 280 may include fins, cylinders, or another expandable surface area.

The expandable heat transfer structures 280 may be formed from a heat conductive material to absorb heat from the first medium 270 and transfer the heat to the cold plate 216 or the housing 202 to remove heat from the first medium 270. For example, the conductive material may include metal, thermally conductive plastics, alumina, ceramics, combinations thereof, and the like.

In accordance with example aspects of the present disclosure, the expandable heat transfer structures 280 may be formed or "printed" using an additive-manufacturing process, such as a 3-D printing process. The use of such a process may allow the expandable heat transfer structures 280 to be formed integrally, as a single monolithic component, or as any suitable number of sub-components. In particular, the manufacturing process may allow expandable heat transfer structures 280 to be integrally formed and include a variety of features not possible when using prior manufacturing methods.

As used herein, the terms "additively manufactured" or "additive manufacturing techniques or processes" refer generally to manufacturing processes wherein successive layers of material(s) are provided on each other to "build-up," layer-by-layer, a three-dimensional component. In some embodiments, the successive layers generally fuse together to form a monolithic component which may have a variety of integral sub-components.

Although additive manufacturing technology is described herein as providing for the fabrication of complex objects by building objects point-by-point, layer-by-layer, typically in a vertical direction, other methods of fabrication are possible and within the scope of the present disclosure. For example, although the discussion herein refers to the addition of material to form successive layers, one skilled in the art will appreciate that the methods and structures disclosed herein may be practiced with any additive manufacturing technique or manufacturing technology. For example, embodiments of the present disclosure may use layer-additive processes, layer-subtractive processes, or hybrid processes.

Suitable additive manufacturing techniques in accordance with the present disclosure include, for example, Fused Deposition Modeling (FDM), Selective Laser Sintering (SLS), 3D printing such as by inkjets and laserjets, Sterolithography (SLA), Direct Selective Laser Sintering (DSLS), Electron Beam Sintering (EBS), Electron Beam Melting (EBM), Laser Engineered Net Shaping (LENS), Laser Net Shape Manufacturing (LNSM), Direct Metal Deposition (DMD), Digital Light Processing (DLP), Direct Metal Laser Sintering (DMLS), and other known processes.

The additive manufacturing processes described herein may be used for forming expandable heat transfer structures 280 using any suitable material. More specifically, according to example embodiments, the components described herein may be formed in part, in whole, or in some combination of materials including but not limited to thermally conductive plastics, pure metals, cobalt alloys, iron-cobalt vanadium alloy, nickel alloys, chrome alloys, titanium, titanium alloys, magnesium, magnesium alloys, aluminum, aluminum alloys, austenite alloys such as nickel-chromium-based superalloys (e.g., those available under the name Inconel® available from Special Metals Corporation), and metal ceramic composite (e.g., an aluminum SiC matrix) alumina, ceramics, combinations thereof, and the like.

One skilled in the art will appreciate that a variety of materials and methods for bonding those materials may be used and are contemplated as within the scope of the present disclosure. As used herein, references to "fusing" may refer to any suitable process for creating a bonded layer of any of the above materials. For example, if the material is powdered metal, the bond may be formed by a melting process. One skilled in the art will appreciate that other methods of fusing materials to make a component by additive manufacturing are possible, and the presently disclosed subject matter may be practiced with those methods.

In addition, the additive manufacturing process disclosed herein allows a single component to be formed from multiple materials. Thus, the components described herein may be formed from any suitable mixtures of the above materials. For example, a component may include multiple layers, segments, or parts that are formed using different materials, processes, and/or on different additive manufacturing machines. In this manner, components may be constructed which have different materials and material properties for meeting the demands of any particular application.

An example additive manufacturing or printing process will now be described. Additive manufacturing processes fabricate components using three-dimensional (3D) information, for example a three-dimensional computer model, of the expandable heat transfer structure 280. Accordingly, a three-dimensional design model of the component may be defined prior to manufacturing. In this regard, a model or prototype of the expandable heat transfer structure 280 may be scanned to determine the three-dimensional information of the component. As another example, a model of the component may be constructed using a suitable computer aided design (CAD) program to define the three-dimensional design model of the expandable heat transfer structure 280.

The design model may include 3D numeric coordinates of the entire configuration of the component including both external and internal surfaces of the component. For example, the design model may define the body, the component base, the surface, any surface features such as irregularities or datum features, as well as internal passageways, openings, support structures, etc. In one example embodiment, the three-dimensional design model is converted into a plurality of slices or segments, e.g., along a central (e.g., vertical) axis of the expandable heat transfer structure 280 or any other suitable axis. Each slice may define a two-dimensional (2D) cross section of the component for a predetermined height of the slice. The plurality of successive 2D cross-sectional slices together form the 3D component. The component is then "built-up" slice-by-slice, or layer-by-layer, until finished.

In this manner, the components described herein may be fabricated using the additive process, or more specifically each layer is successively formed, e.g., by fusing sintering metal powder using laser energy or heat. For example, a particular type of additive manufacturing process may use an energy beam, for example, an electron beam or electromagnetic radiation such as a laser beam, to sinter or melt a powder material. Any suitable laser and laser parameters may be used, including considerations with respect to power, laser beam spot size, and scanning velocity. The build material may be formed by any suitable powder or material selected for enhanced strength, durability, and useful life, particularly at high temperatures.

Each successive layer may be, for example, between about 0.25 mil and 200 mil, although the thickness may be selected based on any number of parameters and may be any suitable size according to alternative embodiments. Therefore, utilizing the additive formation methods described above, the components described herein may have cross sections as thin as one thickness of an associated powder layer, e.g., 10 mil, utilized during the additive formation process.

In addition, utilizing an additive process, the surface finish and features of the components may vary as needed depending on the application. For example, the surface finish may be adjusted (e.g., made smoother or rougher) by selecting appropriate laser parameters during the additive process. A rougher finish may be achieved by increasing laser scan speed or a thickness of the powder layer, and a smoother finish may be achieved by decreasing laser scan speed or the thickness of the powder layer. The scanning pattern and/or laser power can also be changed to change the surface finish in a selected area of the components.

Notably, in example embodiments, several features of the expandable heat transfer structure 280 described herein may not previously be possible due to manufacturing restraints. However, the present disclosure advantageously utilizes current advances in additive manufacturing techniques to develop example embodiments of such components generally in accordance with the present disclosure. Additive manufacturing provides a variety of manufacturing advantages, including ease of manufacturing, reduced cost, greater accuracy, etc.

In this regard, utilizing additive manufacturing methods, even multi-part components may be formed as a single piece of continuous metal, and may thus include fewer subcomponents and/or joints compared to prior designs. The integral formation of these multi-part components through additive manufacturing may advantageously improve the overall assembly process. For example, the integral formation reduces the number of separate parts that must be assembled, thus reducing associated time and overall assembly costs. Additionally, existing issues with, for example, leakage, joint quality between separate parts, and overall performance may advantageously be reduced.

Also, the additive manufacturing methods described above enable much more complex and intricate shapes and contours of the components described herein. For example, such components may include thin cross sectional layers and novel surface features. All of these features may be relatively complex and intricate for avoiding detection and/or impeding counterfeiting by a third party. In addition, the additive manufacturing process enables the manufacture of a single component having different materials such that different portions of the component may exhibit different performance characteristics. The successive, additive nature of the manufacturing process enables the construction of these features.

The expandable heat transfer structure 280 may include a first end 282, a second end 284, and a bellow structure 286 (e.g., accordion structure) that is configured to expand or contract to increase or decrease the distance between the first end 282 and the second end 284. In other embodiments, the expandable heat transfer structure 280 may have another structure such as a bladder or flexible fin.

Figure 7:
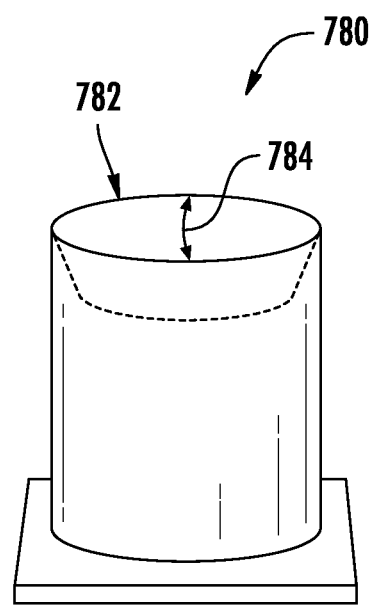
FIG. 7 is a schematic illustration of an expandable heat transfer structure in accordance with an exemplary aspect of the present disclosure.

Referring momentarily to FIGS. 6-9, FIG. 6 shows an expandable heat transfer structure 680 including a distal end 682 that is expandable in a direction 684 via a bellows structure. FIG. 7 shows an expandable heat transfer structure 780 that is cylindrical and includes a distal end 782 that is expandable in a direction 784 via a gusset structure.

Figure 8:
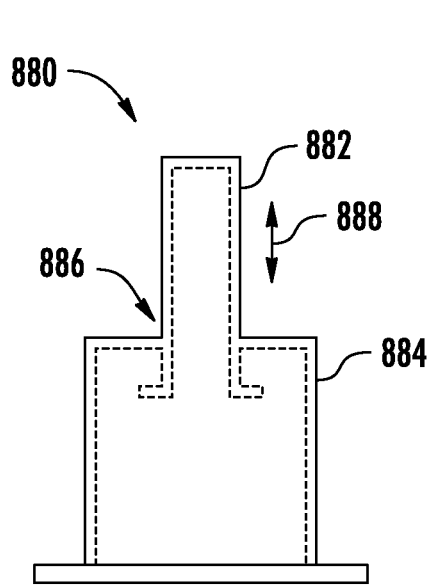
FIG. 8 is a schematic illustration of an expandable heat transfer structure in accordance with an exemplary aspect of the present disclosure.

FIG. 8 shows an expandable heat transfer structure 880 that is expandable via a gas spring structure. The expandable heat transfer structure 880 includes a piston 882 and a cylinder 884. The piston 882 is configured to move in a direction 888 through an opening 886 in the cylinder 884 with change in pressure inside and/or outside the expandable heat transfer structure 880.

Figure 9:
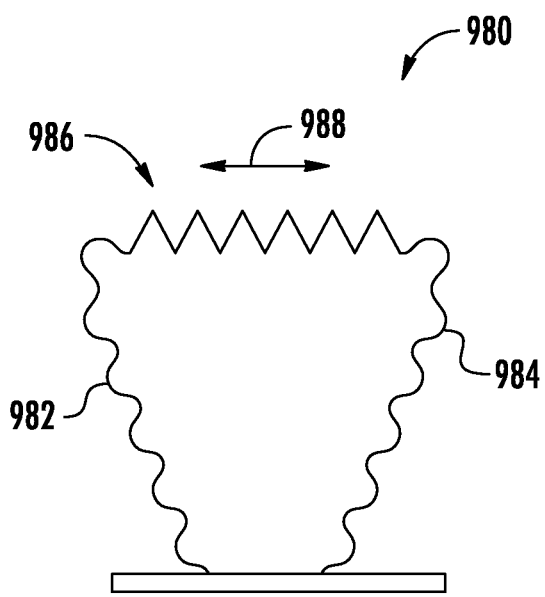
FIG. 9 is a schematic illustration of an expandable heat transfer structure in accordance with an exemplary aspect of the present disclosure.

FIG. 9 shows an expandable heat transfer structure 980 including curved, aluminum sidewalls 982, 984 and a flexible distal end 986 that is expandable in a direction 988. The expandable heat transfer structure 980 can function as a fin to enhance convection heat transfer.

Continuing with FIG. 4, the first end 282 of some of the expandable heat transfer structures 280 is connected to the cold plate 216, and these expandable heat transfer structures 280 extend from the cold plate 216 into the first medium 270. The second end 284 of other expandable heat transfer structures 280 is connected to the housing 202, and these expandable heat transfer structures 280 extend from the housing 202 into the first medium 270.

Heat may transfer from the first medium 270 to the expandable heat transfer structures 280 through convection, from the first medium 270 to the cold plate 216 through convection, and from the first medium 270 to the housing 202 through convection. Heat may transfer from the expandable heat transfer structures 280 to the cold plate 216 through conduction, and from the expandable heat transfer structures 280 to the housing 202 through conduction.

The expandable heat transfer structures 280 may be filled with a second medium 290 (e.g., a gas) and sealed. Accordingly, the expandable heat transfer structures 280 are configured to regulate the pressure of the first medium 270.

As the pressure of the environment around the turbofan engine 10 drops (e.g., at higher altitudes for the turbofan engine 10), the potential for strike or creep in the power converter assembly 81 may increase.

The second medium 290 may be selected and the expandable heat transfer structures 280 may be sealed and pressurized such that, as the pressure drops around the power converter assembly 81, the drop in pressure around the components 236 in the housing 202 is reduced. In particular, as the pressure of the first medium 270 drops (e.g., due to temperature changes), the pressurized expandable heat transfer structures 280 may expand to maintain or reduce the drop in pressure of the first medium 270 around the components 250 and thereby reduce the potential for strike or creep between components 250.

The expandable heat transfer structures 280 may also contract to relieve pressure buildup in the first medium 270. For example, the expandable heat transfer structures 280 allow expansion of the first medium 270 (e.g., due to temperature changes).

As the weight of the first medium 270 contributes to the weight of the power converter assembly 81, the weight of the power converter assembly 81 may be reduced by reducing the volume of the first medium 270 in the housing 202. In particular, the volume of the first medium 270 may be reduced by one or more volumes of expandable heat transfer structures 280. Accordingly, as the second medium 290 may be selected to have a lower weight than the first medium 270, the weight of the power converter assembly 81 can be reduced. For example, the first medium 270 may be oil and the second medium 290 may be an inert gas.

The components in the housing 202 may take up a large percentage (e.g., 60%) of the total volume of the cavity 204 of the housing 202. The spacing of the components may depend on voltage, strike, creep, etc. Of the remaining volume of the cavity 204 of the housing 202, there will be volume attributed to the first medium 270 (dielectric fluid) and the expandable heat transfer structures 280. For example, the expandable heat transfer structures 280 may take up 25-60% of the remaining volume or 10-25% of the total volume.

The power converter assembly 81 may have a high power density. For example, the power converter assembly 81 may have a power density of at least 14 kilowatts/kilograms. Power density is increased at least by reducing the weight of the power converter assembly 81 with the addition of the expandable heat transfer structures 280.

Figure 5:
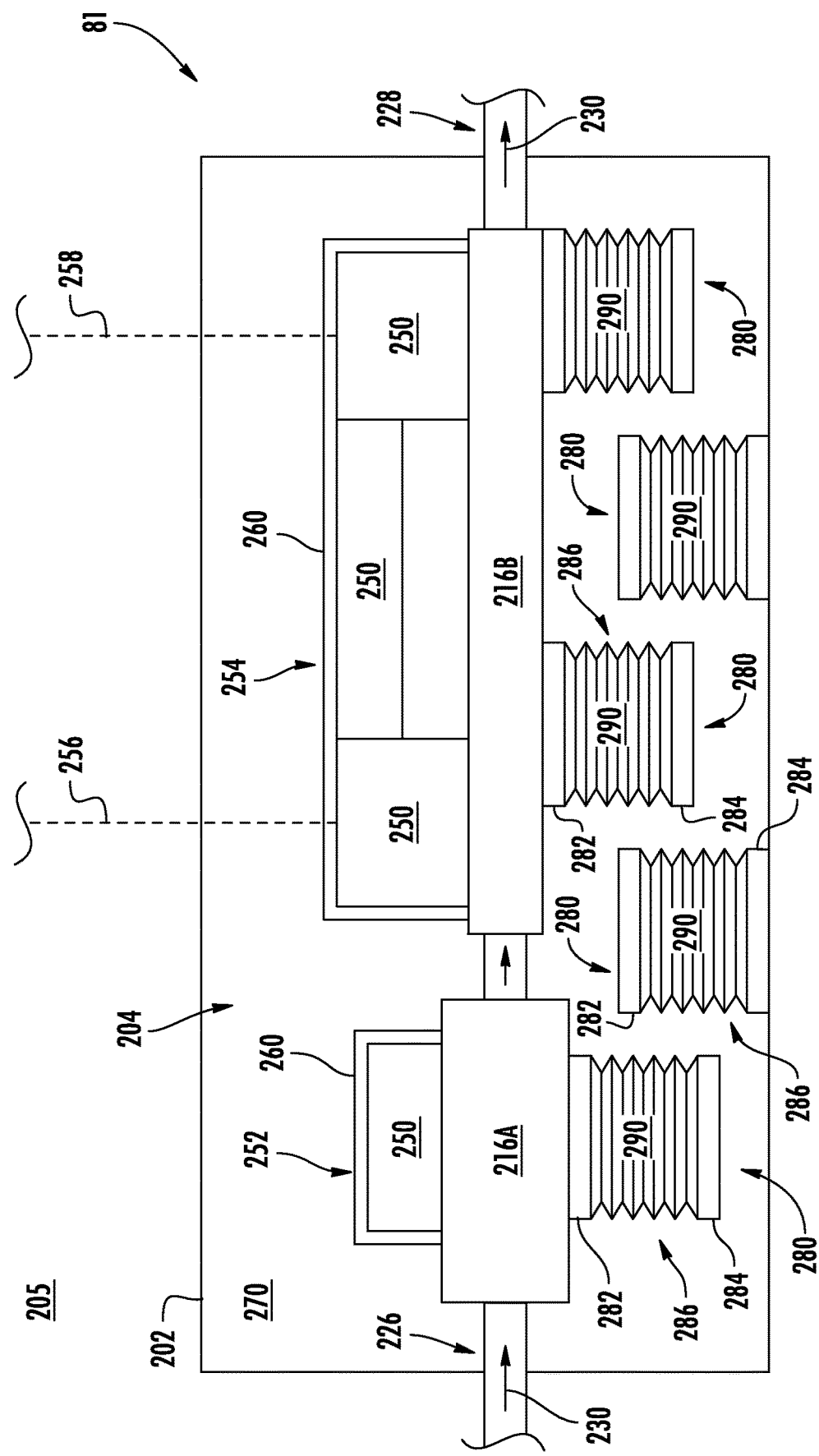
FIG. 5 is a schematic illustration of a power converter assembly in accordance with an exemplary aspect of the present disclosure.
Figure 6:
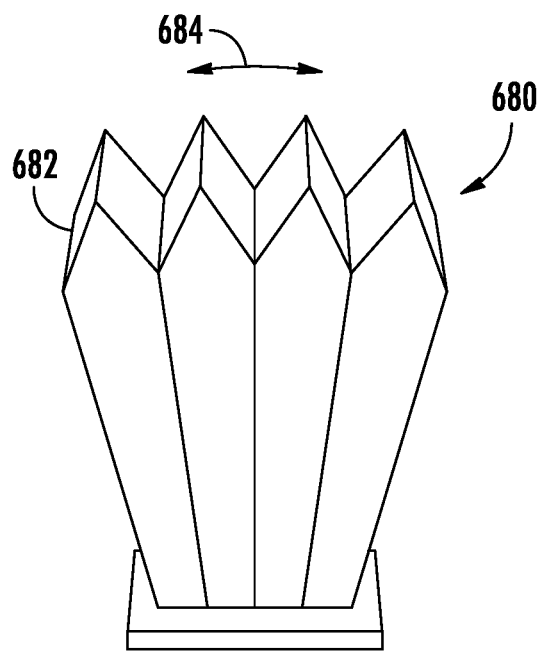
FIG. 6 is a schematic illustration of an expandable heat transfer structure in accordance with an exemplary aspect of the present disclosure.

In general, the power converter assembly 81 includes components 250 and one or more cold plates 216 that cool the components 250. Referring to FIG. 5, a power converter assembly 81 including two cold plates (a first cold plate 216A and a second cold plate 216B) is described in further detail. However, it should be understood that other numbers of cold plates are contemplated.

The cold plates 216A, 216B may be made of metal or an electrically insulating material such as thermally conductive plastics. The cold plates 216A, 216B may have extended heat transfer surfaces such as fins, etc. to maximize heat transfer from the first medium 270 to the cold plates 216A, 216B.

As described above, the components 250 may include the first set of components 252 and the second set of components 254. The first set of components 252 may be high power devices such as high-power switching modules (e.g., silicon carbide power MOSFETs, silicon carbon IGBT, silicon MOSFETs, silicon IGBTs, gate drivers, controls, etc.) that do a majority of the work and generate a majority of the heat. The second set of components 254 may be auxiliary devices or "balance of plant" devices (e.g., capacitors, inductors, resistors, bus bars, etc.).

The first set of components 252 may be disposed on the first cold plate 216A and the second set of components 254 may be disposed on the second cold plate 216B.

A large fraction of thermal dissipation (e.g., 75%, etc.) may occur with the first set of components 252 and a smaller fraction (e.g., 25%, etc.) of thermal dissipation may occur with the second set of components 254.

The first cold plate 216A may be upstream of the second cold plate 216B with respect to the coolant reservoir 240 such that the coolant 230 is first used to transfer heat from the first set of components via the first cold plate 216A and is later used to transfer heat from the second set of components via second cold plate 216B. Accordingly, the first set of components 252 are cooled by a dedicated cold plate 216A where the coolant 230 is first received from the coolant reservoir 240.

The power converter assembly includes components that may be potted and disposed in a dielectric medium that protects against high voltage arc and discharge, sparking, and other damaging events.

The power converter may be located in a high-temperature environment (e.g., high thermal ambient temperatures such as 100-300 Celsius). In general, the components of the power converter are protected from ambient temperature by a housing and may reject heat to a coolant in a cold plate or to the dielectric medium surrounding the power converter.

The power converter assembly includes an expandable heat transfer structure. Heat is transferred from the dielectric medium to the expandable heat transfer structure and then from the expandable heat transfer structure to one of the housing or a cold plate to which the expandable heat transfer structure is attached to remove heat from the dielectric medium.

When operating at high altitude, pressures are lower, which can contribute to high voltage arc and discharge, sparking, strike, creep, breakdown of insulation, and other damaging events. For example, up to 50,000 feet above mean seal level, pressures may be on the order of 0.15 atmospheres. At such conditions, for the same geometry and spacing and material medium, breakdown and discharge can occur at $1/10$th the voltage at atmospheric conditions.

To prevent such events, the power converter 81 is sealed and the first medium 270 is used to provide sufficient dielectric protection. For a sealed power converter 81, the volume of the first medium 270 changes with temperature and changes the pressure in the sealed power converter 81.

The expandable heat transfer structures are pressurized with a gas or other medium. Accordingly, where the pressure and volume of the dielectric medium is lower at lower temperature, the expandable heat transfer structures expand in volume, and, where the pressure and volume of the dielectric medium is higher at higher temperature, the expandable heat transfer structures contract in volume.

As an example, for an exemplary dielectric liquid, a 1 degree temperature rise can lead to a 0.15% change in volume and a pressure rise of about 10 bars for a container that is rigid and leakproof. The expandable heat transfer structures 280 (e.g., gas filled) can compress to accommodate a rise in pressure and prevent a large rise in the dielectric fluid pressure.

A gas in an expandable heat transfer structure 280 could have a density about $1/1000$ of the dielectric liquid. Accordingly, having volume occupied by gas instead of liquid could lead to significant weight savings.

The density of the medium in the expandable heat transfer structures may be less than the density of the dielectric medium to reduce the overall weight of the power converter assembly and improve the power density of power converter assembly.

This written description uses examples to disclose the present disclosure, including the best mode, and also to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

Further aspects are provided by the subject matter of the following clauses:

A power converter assembly, comprising: a housing; a cold plate in the housing, wherein the cold plate is configured to receive a coolant; a set of power converter components on the cold plate; a first medium in the housing surrounding the cold plate and components; and an expandable heat transfer structure attached to one of the cold plate and the housing.

The power converter assembly according to one or more of these clauses, wherein the expandable heat transfer structure is attached to the cold plate.

The power converter assembly according to one or more of these clauses, wherein the first medium is a liquid or pressurized gas that provides a dielectric resistance.

The power converter assembly according to one or more of these clauses, wherein the first medium is an oil.

The power converter assembly according to one or more of these clauses, wherein the expandable heat transfer structure includes a conductive material that is configured to transfer heat to the one of the cold plate and the housing.

The power converter assembly according to one or more of these clauses, wherein the expandable heat transfer structure has an expandable surface area.

The power converter assembly according to one or more of these clauses, wherein the expandable heat transfer structure is additively manufactured.

The power converter assembly according to one or more of these clauses, wherein the expandable heat transfer structure is filled with a gas.

The power converter assembly according to one or more of these clauses, wherein the first medium is a liquid that provides dielectric resistance.

The power converter assembly according to one or more of these clauses, wherein at least some of the components are covered with a solid insulating material.

The power converter assembly according to one or more of these clauses, wherein the cold plate is a first cold plate and the power converter assembly further comprising a second cold plate.

The power converter assembly according to one or more of these clauses, wherein the first cold plate and the second cold plate are configured such that the first cold plate is upstream with respect to the second cold plate.

The power converter assembly according to one or more of these clauses, wherein the components include a first set of components and a second set of components, wherein the first set of components are on the first cold plate and the second set of components are on the second cold plate.

The power converter assembly according to one or more of these clauses, wherein the first set of components are configured to generate more heat than the second set of components.

The power converter assembly according to one or more of these clauses, wherein the first set of components includes high-power switching modules.

The power converter assembly according to one or more of these clauses, wherein the high-power switching modules include at least one of a MOSFET, an IGBT, and a gate driver.

The power converter assembly according to one or more of these clauses, wherein the second set of components includes auxiliary components.

The power converter assembly according to one or more of these clauses, wherein the auxiliary components include at least one of a capacitor, an inductor, a resistor, and a bus bar. a capacitor, an inductor, a resistor, a bus bar, a control board, a gate driver board, and an interface board.

The power converter assembly according to one or more of these clauses, wherein the first medium is sealed in the housing.

The power converter assembly according to one or more of these clauses, wherein the expandable heat transfer structure includes at least one of a bellows structure, a gusset structure, and a gas spring structure.

We claim:

1. A power converter assembly, comprising:
   a housing;
   a cold plate in the housing, wherein the cold plate is configured to receive a coolant;
   a set of power converter components on the cold plate;
   a first medium in the housing surrounding the cold plate and components; and
   an expandable heat transfer structure attached to one of the cold plate and the housing.

2. The power converter assembly of claim 1, wherein the expandable heat transfer structure is attached to the cold plate.

3. The power converter assembly of claim 1, wherein the first medium is a liquid or pressurized gas that provides a dielectric resistance.

4. The power converter assembly of claim 1, wherein the first medium is an oil.

5. The power converter assembly of claim 1, wherein the expandable heat transfer structure includes a conductive material that is configured to transfer heat to the one of the cold plate and the housing.

6. The power converter assembly of claim 1, wherein the expandable heat transfer structure has an expandable surface area.

7. The power converter assembly of claim 1, wherein the expandable heat transfer structure is additively manufactured.

8. The power converter assembly of claim 1, wherein the expandable heat transfer structure is filled with a gas.

9. The power converter assembly of claim 8, wherein the first medium is a liquid that provides dielectric resistance.

10. The power converter assembly of claim 1, wherein at least some of the components are covered with a solid insulating material.

11. The power converter assembly of claim 1, wherein the cold plate is a first cold plate and the power converter assembly further comprising a second cold plate.

12. The power converter assembly of claim 11, wherein the first cold plate and the second cold plate are configured such that the first cold plate is upstream with respect to the second cold plate.

13. The power converter assembly of claim 12, wherein the components include a first set of components and a second set of components, wherein the first set of components are on the first cold plate and the second set of components are on the second cold plate.

14. The power converter assembly of claim 13, wherein the first set of components are configured to generate more heat than the second set of components.

15. The power converter assembly of claim 13, wherein the first set of components includes high-power switching modules.

16. The power converter assembly of claim 15, wherein the high-power switching modules include at least one of a MOSFET, an IGBT, and a gate driver.

17. The power converter assembly of claim 13, wherein the second set of components includes auxiliary components.

18. The power converter assembly of claim 17, wherein the auxiliary components include at least one of a capacitor, an inductor, a resistor, and a bus bar, a capacitor, an inductor, a resistor, a bus bar, a control board, a gate driver board, and an interface board.

19. The power converter assembly of claim 1, wherein the first medium is sealed in the housing.

20. The power converter assembly of claim 1, wherein the expandable heat transfer structure includes at least one of a bellows structure, a gusset structure, and a gas spring structure.

* * * * *